(12) United States Patent
Hong et al.

(10) Patent No.: US 6,784,475 B2
(45) Date of Patent: Aug. 31, 2004

(54) THERMALLY STABLE FERROELECTRIC MEMORY

(75) Inventors: Seung-bum Hong, Kyungki-do (KR); Hyun-jung Shin, Kyungki-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/325,731

(22) Filed: Dec. 23, 2002

(65) Prior Publication Data

US 2003/0218196 A1 Nov. 27, 2003

(30) Foreign Application Priority Data

May 23, 2002 (KR) ........................................ 2002-28656

(51) Int. Cl.$^7$ .............................................. H01L 29/72
(52) U.S. Cl. ...................... 257/295; 257/296; 257/301; 257/304
(58) Field of Search ................................. 257/295, 296, 257/301, 304

(56) References Cited

U.S. PATENT DOCUMENTS

2003/0030079 A1 * 2/2003 Hsu et al. .................. 257/295

* cited by examiner

*Primary Examiner*—Edward Wojciechowicz
(74) *Attorney, Agent, or Firm*—Burns, Doane, Swecker & Mathis, L.L.P.

(57) ABSTRACT

A thermally-stable ferroelectric memory is provided. The ferroelectric memory includes a lower electrode and a ferroelectric layer formed on the top surface of the lower electrode such that a domain having a dielectric polarization is set as a bit. The thickness of the ferroelectric layer is not greater than the size of the bit. Accordingly, a non-volatile ferroelectric memory which is thermally stable is provided, thereby realizing a reliable memory which can store information at high speed and high density and has improved memory retention.

18 Claims, 7 Drawing Sheets

(a)   (b)   (c)

(a)   (b)   (c)

(a)   (b)   (c)

THERMALLY STABLE FERROELECTRIC MEMORY

CROSS-REFERENCE TO RELATED APPLICATIONS

This application claims priority under 35 U.S.C. §§119 and/or 365 to 2002-28656 filed in Korea on Mar. 23, 2002; the entire content of which is hereby incorporated by reference.

BACKGROUND OF THE INVENTION

1. Field of the Invention

The present invention relates to a ferroelectric memory, and more particularly, to a high-density ferroelectric memory which is thermally stable.

2. Description of the Related Art

In a ferroelectric memory, the size of a domain is small and a polarization direction can change quickly, and thus it has attracted much attention and is seen as a potential next-generation memory. Ferroelectric Random Access Memory (FeRAM) is an example of conventional memory using a ferroelectric material.

FeRAM stores information using a capacitor formed of ferroelectric materials, which may be spontaneously polarized at a temperature lower than a predetermined temperature and may have the magnitude and direction of polarization, which can be controlled and reversed, respectively, by an external electric field. Since a ferroelectric capacitor is on the scale of microns in size, it does not have a serious problem regarding the thermal stability of a domain at which dielectric polarization occurs. However, it has limitations in size, recording and reproducing speed, and information integration density.

To realize a memory having a small size, high integration density, and improved recording and reproducing speed, a memory which can record and reproduce information using a probe has been researched.

However, a probe-type storage medium using a ferroelectric material has a fatigue phenomenon, in which storage capacity decreases as the number of read/write cycles increases over a predetermined value, and an aging phenomenon, in which polarization gradually disappears as time lapses. The time for which a ferroelectric memory can store information without switching is referred to as a retention time. The retention time increases as resistant ability to the aging phenomenon of polarization increases.

To increase the reliability of information storage in a memory using a ferroelectric material, it is necessary to hinder the fatigue phenomenon and increase the retention time. Accordingly, a method for increasing the thermal stability of bits is desired for the latter aspect.

SUMMARY OF THE INVENTION

To solve the above-described problems, it is an object of the present invention to provide a ferroelectric memory which can increase the reliability of information storage by increasing the thermal stability of bits.

To achieve the above object of the present invention, there is provided a ferroelectric memory including a lower electrode, and a ferroelectric layer formed on the top surface of the lower electrode such that a domain having a dielectric polarization is set as a bit. The thickness of the ferroelectric layer is not greater than the size of the bit.

The thickness "d" of the ferroelectric layer satisfies Formula (1) with respect to the area A of the bit.

$$d \leq 2\sqrt{A/\pi} \qquad (1)$$

Accordingly, the present invention forms nano-sized ferroelectric domains penetrating a ferroelectric layer in a ferroelectric memory, thereby increasing the thermal stability of bits. Consequently, reliability of information storage can be improved.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1A:
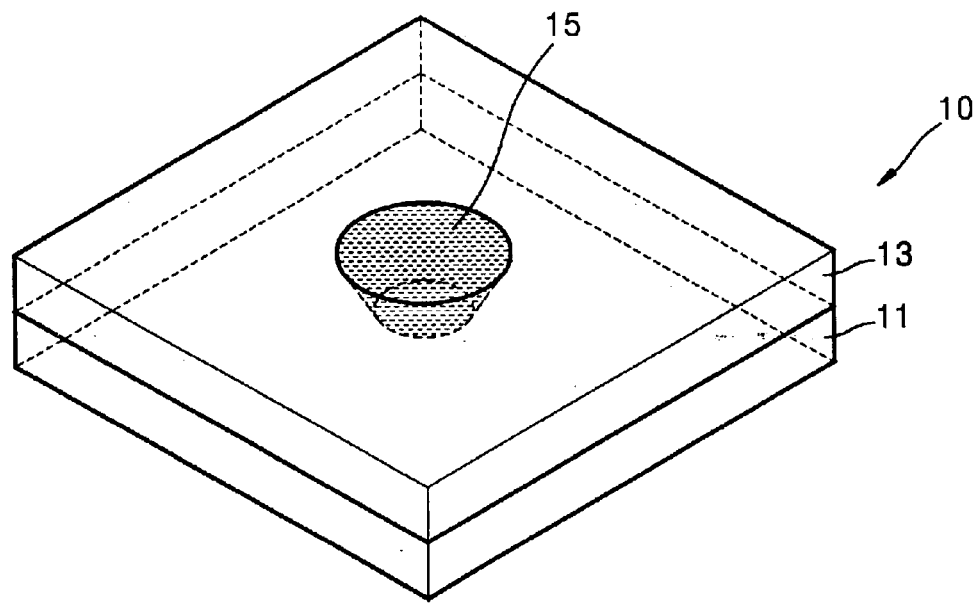
FIG. 1A is an elevated perspective view of a ferroelectric memory according to an embodiment of the present invention.

Hereinafter, a ferroelectric memory according to an embodiment of the present invention will be described in detail with reference to the attached drawings. In the drawings, the thicknesses of the ferroelectric layer and the lower electrode, which are included in the ferroelectric memory, are exaggerated for clarity.

Figure 1B:
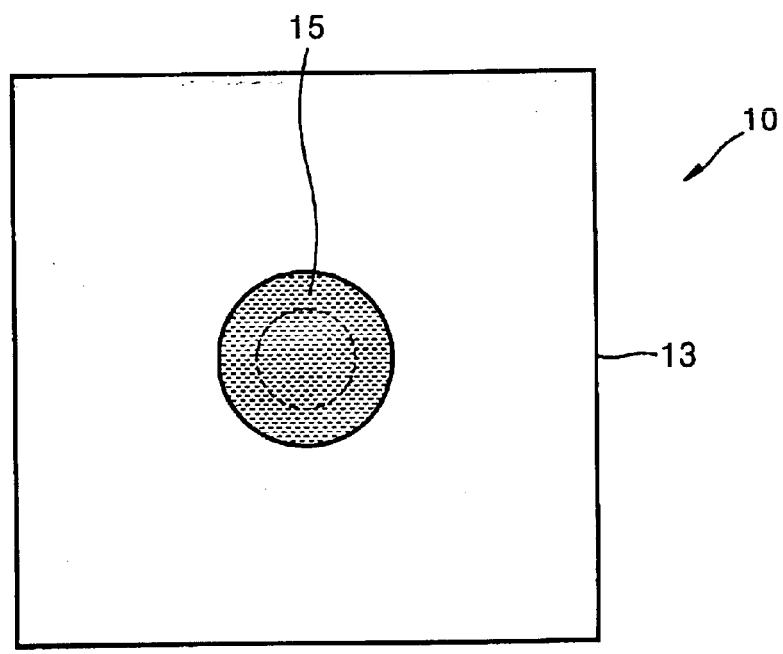
FIG. 1B is a plane view of a ferroelectric memory according to the embodiment of the present invention.
Figure 1C:
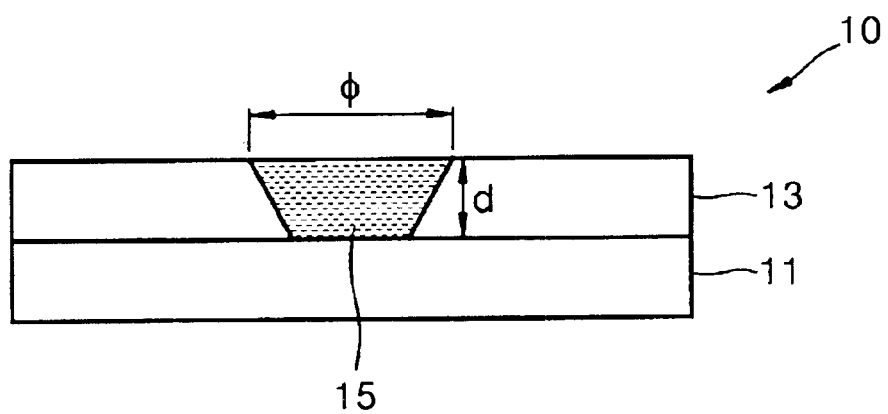
FIG. 1C is a cross-sectional view of a ferroelectric memory according to the embodiment of the present invention.

FIGS. 1A through 1C are perspective, plane, and cross-sectional views, respectively, of a ferroelectric memory according to an embodiment of the present invention. Referring to FIGS. 1A through 1C, a ferroelectric memory 10 according to an embodiment of the present invention includes a lower electrode 11 and a ferroelectric layer 13 deposited on the top surface of the lower electrode 11.

If a direct current (DC) pulse is applied between the lower electrode 11 and a nanometer-size tip (not shown), dielectric polarization locally aligns in the ferroelectric layer 13. There are up and down polarization directions, and "0" or "1" indicates the up or down polarization direction. The polarization direction acts as a bit in a memory device. The size, i.e., diameter $\Phi$, of a bit is greater than or equal to the thickness d of the ferroelectric layer 13 as shown in Formula (2).

$$d \leq \Phi \qquad (2)$$

Particularly, in a case where a domain has a circular shape, as shown in the drawings, when the area of a bit is A, Formula (1) is satisfied. Formula (1) is inferred from Formula (3) which concerns the bit area A.

$$A = \pi(\Phi/2)^2 \qquad (3)$$

The best advantages of a memory device according to the present invention are a high memory density of at least 100 Gbit/in$^2$ and a long retention time of at least 10 years, so the memory device according to the present invention satisfies the conditions of small bit size, fast operating speed, and long retention time, which are required of non-volatile ultrahigh-density memory devices.

FIGS. 2 through 5 show the results of testing the thermal stability of a bit in a non-volatile ferroelectric memory device according to the embodiment of the present invention.

Figure 2:
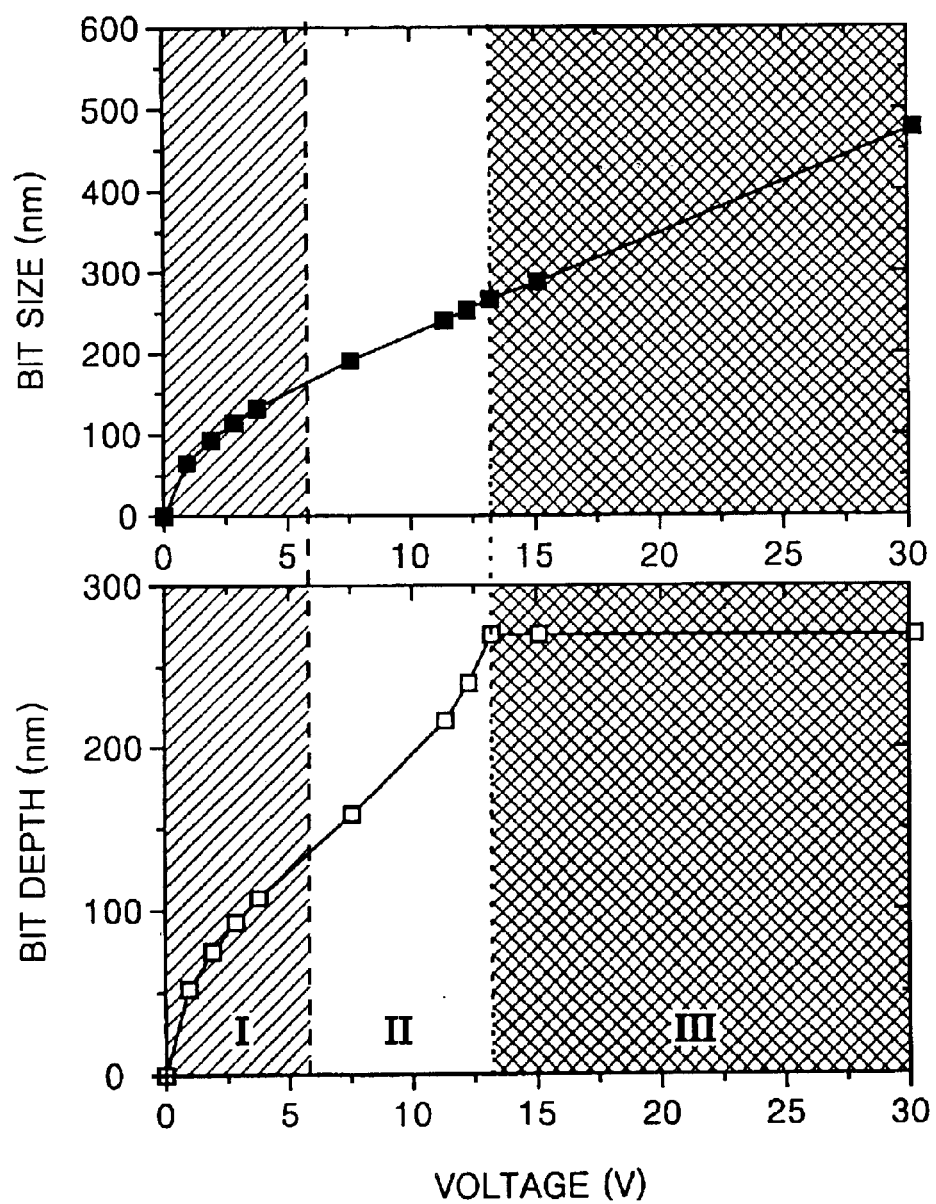
FIG. 2 shows bit size with respect to voltage in an upper graph and bit depth with respect to voltage in a lower graph, according to the embodiment of the present invention.

FIG. 2 shows a relationship between bit size and voltage in an upper graph and a relationship between bit depth and voltage in a lower graph. We can divide the voltage range into three regions depending on bit images in terms of amplitude and phase. As the voltage increases, the bit size increases in proportion to the voltage, and the bit depth increases in proportion to the voltage in the regions I and II. However, in the region III, the bit depth remains constant regardless of a change in voltage.

The bit size must be reduced in order to increase information storage density. Accordingly, a pulse voltage must be reduced to form smaller bits. However, as the voltage is lowered, the bit depth is decreased, causing a problem in the thermal stability of a bit. Accordingly, it is necessary to find the proper condition for the bit size and bit depth to satisfy both thermal stability of a bit and high information storage density.

The bit size and the bit depth vary with a pulse voltage, and the image of amplitude of a bit varies with the thickness of a ferroelectric layer. The structures of a bit according to the image of an amplitude are classified into a dot structure, an egg structure, and a ring structure.

Figure 3A:
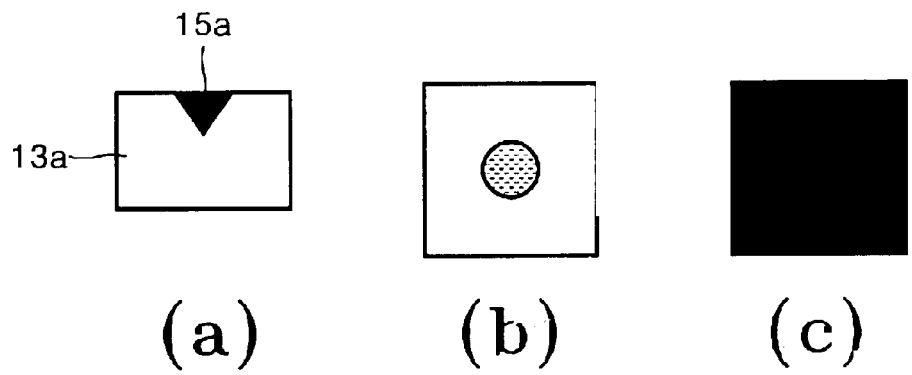
FIG. 3A shows a cross-sectional view (a) of a dot structure in a ferroelectric memory according to the embodiment of the present invention, a plane view (b) of an amplitude image of the dot structure, and a plane view (c) of a phase image of the dot structure.
Figure 3B:
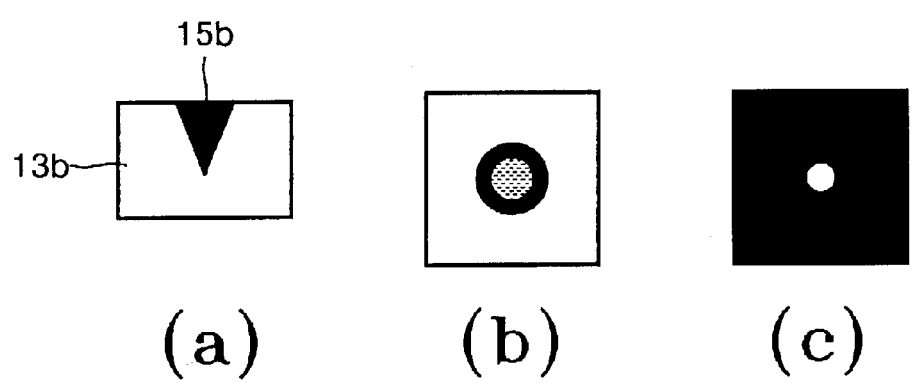
FIG. 3B shows a cross-sectional view (a) of an egg structure in a ferroelectric memory according to the embodiment of the present invention, a plane view (b) of an amplitude image of the egg structure, and a plane view (c) of a phase image of the egg structure.
Figure 3C:
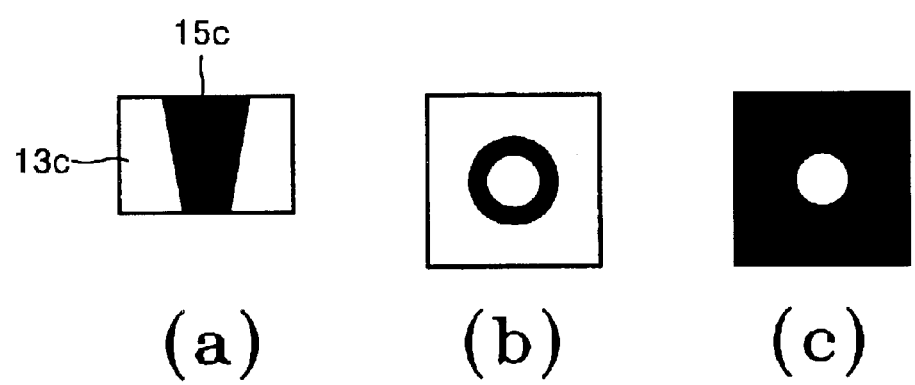
FIG. 3C shows a cross-sectional view (a) of a ring structure in a ferroelectric memory according to the embodiment of the present invention, a plane view (b) of an amplitude image of the ring structure, and a plane view (c) of a phase image of the ring structure.

FIGS. 3A through 3C schematically show the shape of a domain formed on a ferroelectric layer in regions I through III, an amplitude image of the domain, and a phase image of the domain.

FIG. 3A shows a cross-sectional view (a) of a dot structure, a plane view (b) of an amplitude image, and a plane view (c) of a phase image when a pulse voltage is between 0 V and 6 V, i.e., region I in FIG. 2. Referring to the cross-sectional view (a), a bit 15a has a depth less than half the thickness of a ferroelectric layer 13a in the dot structure. It can be inferred from FIG. 2 that the depth of the bit 15a is about 0–120 nm. Here, as shown in the plane view (b), an amplitude in a portion where a dielectric polarization is formed is less than an amplitude in the periphery surrounding the portion, so a dark dot is shown. As shown in the plane view (c), there is no difference in the phase between the portion having a dielectric polarization and the periphery, so the entire image is black.

FIG. 3B shows a cross-sectional view (a) of an egg structure, a plane view (b) of an amplitude, and a plane view (c) of a phase when a pulse voltage is between 6 V and 13 V, i.e., region II in FIG. 2. Referring to the cross-sectional view (a), a bit 15b has a depth greater than half the thickness of a ferroelectric layer 13b in the egg structure. It can be inferred from FIG. 2 that the depth of the bit 15b is about 120–270 nm. Here, as shown in the plane view (b), a portion where a dielectric polarization is formed has a black rim, in which an amplitude is less than that in the periphery surrounding the portion, and an inner dark dot, in which an amplitude is greater than that in the rim and less than that in the periphery surrounding the portion, so an egg image is shown. As shown in the plane view (c), the bit portion is partially reversed, appearing bright. Here, the bit size is less than the size of a domain having the egg structure shown in the plane view (b).

FIG. 3C shows a cross-sectional view (a) of a ring structure, a plane view (b) of an amplitude, and a plane view (c) of a phase when a pulse voltage is between 13 V and 30 V, i.e., region III in FIG. 2. Referring to the cross-sectional view (a), a bit 15c is formed penetrating a ferroelectric layer 13c in the ring structure. It can be inferred from FIG. 2 that the depth of the bit 15c is about 275 nm. Here, as shown in the plane view (b), a ring portion, in which an amplitude is smaller than those in other portions except the ring portion, is black. As shown in the plane view (c), the bit portion is reversed, appearing bright.

Figure 4A:
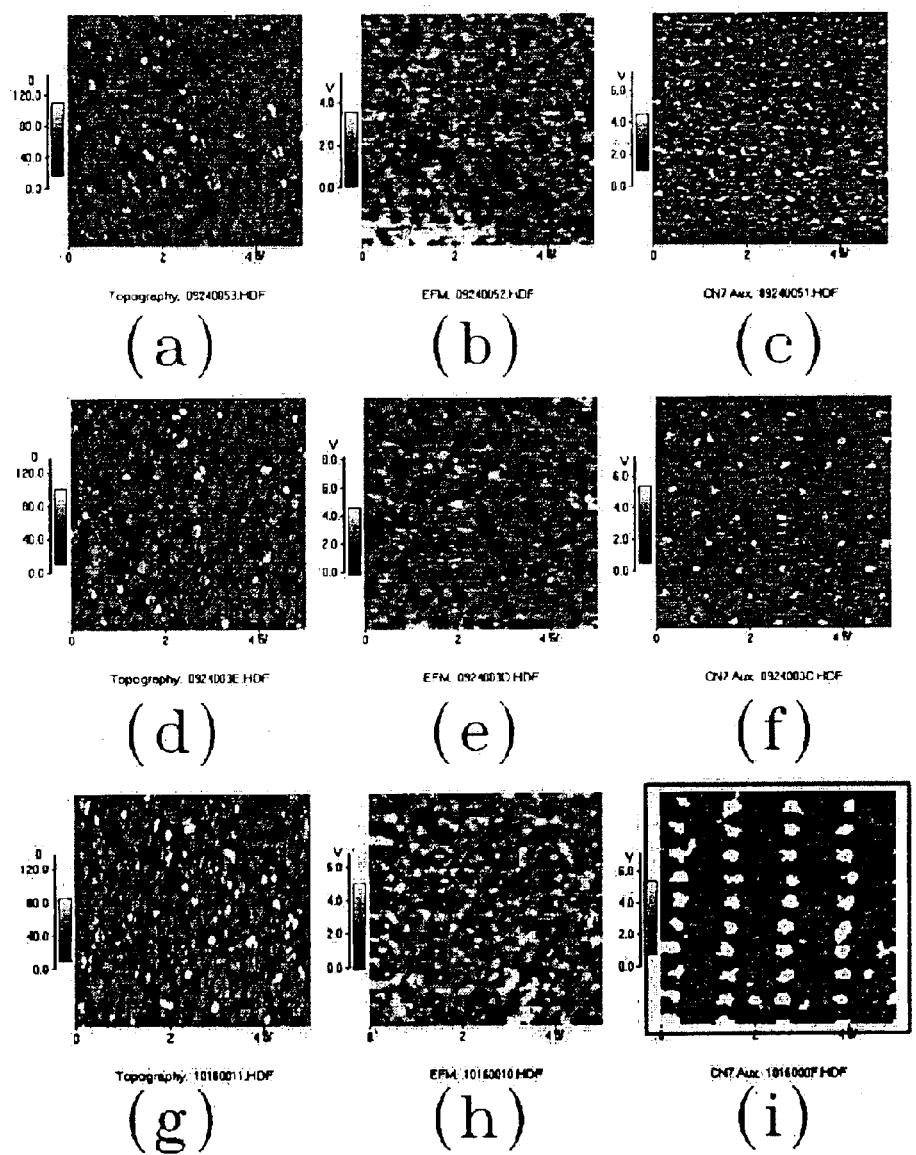
FIG. 4A shows piezoelectric force microscopy (PFM) images (a), (b), and (c) showing topography, amplitude, and phase, respectively, of a dot structure, PFM images (d), (e), and (f) showing topography, amplitude, and phase, respectively, of an egg structure, and images (g), (h), and (i) showing topography, amplitude, and phase, respectively, of a ring structure, all before aging, in a ferroelectric memory according to the embodiment of the present invention.
Figure 4B:
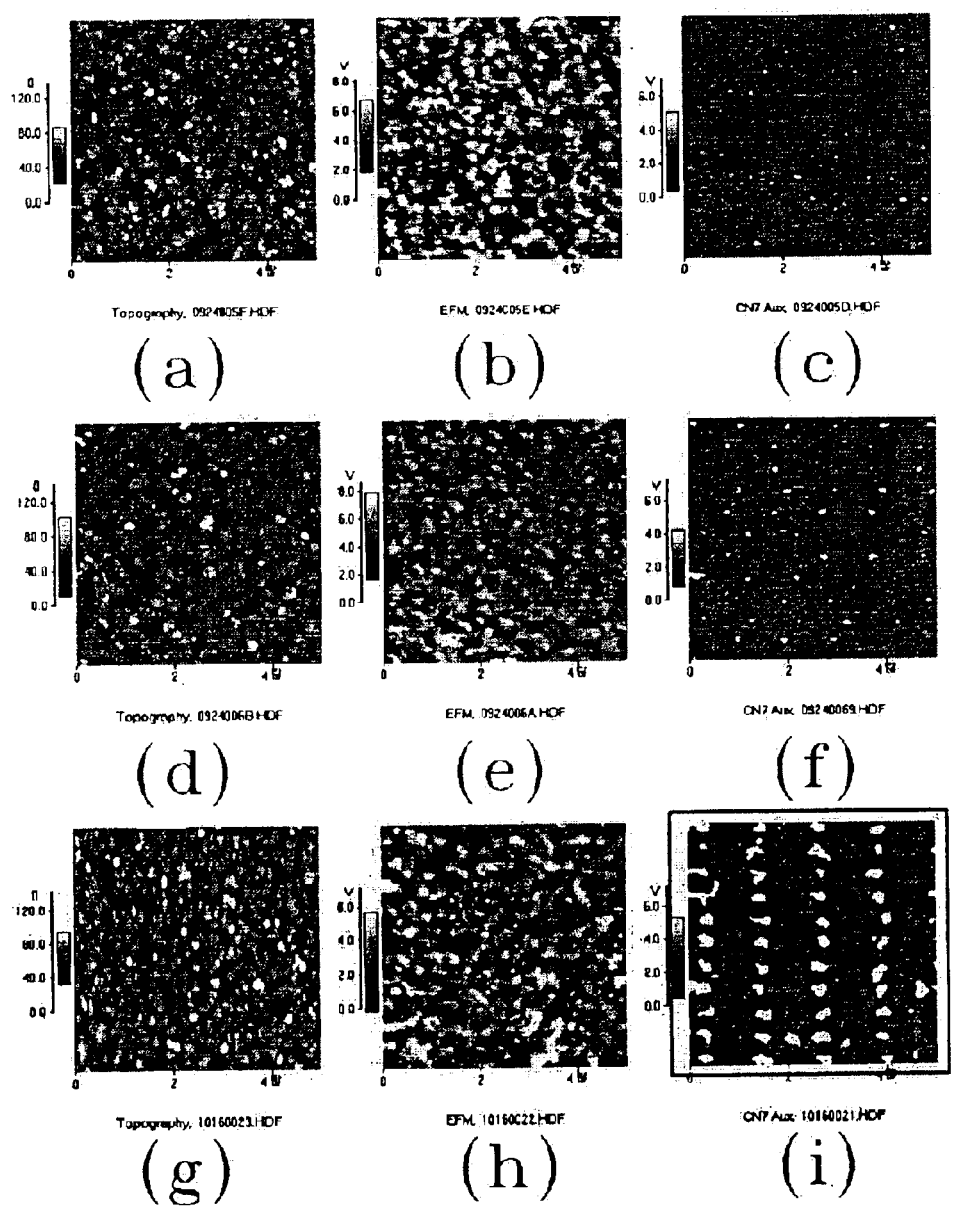
FIG. 4B shows PFM images (a), (b), and (c) showing topography, amplitude, and phase, respectively, of a dot structure, PFM images (d), (e), and (f) showing topography, amplitude, and phase, respectively, of an egg structure, and PFM images (g), (h), and (i) showing topography, amplitude, and phase, respectively, of a ring structure, all after aging, in a ferroelectric memory according to the embodiment of the present invention.

FIG. 4A shows piezoelectric force microscopy (PFM) images showing topography (a), amplitude (b), and phase (c) when a dot structure is formed in a ferroelectric layer before aging; topography (d), amplitude (e), and phase (f) when an egg structure is formed in a ferroelectric layer before aging; and topography (g), amplitude (h), and phase (i) when a ring structure is formed in a ferroelectric layer before aging. FIG. 4B shows PFM images showing changes of topography (a), amplitude (b), and phase (c) in the dot structure; changes of topography (d), amplitude (e), and phase (f) in the egg structure; and changes of topography (g), amplitude (h), and phase (i) in the ring structure, all after aging was performed at 100° C. for 30 minutes.

In the case of the dot structure formed by a pulse of 1 ms, it can be seen that a uniform arrangement of dot-shaped bits ((b) of FIG. 4A) was changed into a non-uniform arrangement ((b) of FIG. 4B). When a phase image shown in photograph (c) of FIG. 4A is compared with a phase image shown in the photograph (c) of FIG. 4B, it can be seen that the number of bits decreased after aging.

In the case of the egg structure formed by a pulse of 3 ms, a before-aging egg-shaped amplitude ((e) of FIG. 4A) was changed into an after-aging dot-shaped image ((e) of FIG. 4B). For a phase image, the number of bits shown in photograph (f) of FIG. 4A was reduced in photograph (f) of FIG. 4B.

In the case of the ring structure formed by a pulse of 5 ms, it can be seen that the amplitude barely changed after aging process. When a phase image shown in the photograph (i) of FIG. 4A is compared with a phase image shown in the photograph (i) of FIG. 4B, it can be seen that the number of bits was maintained to be nearly constant.

Figure 5:
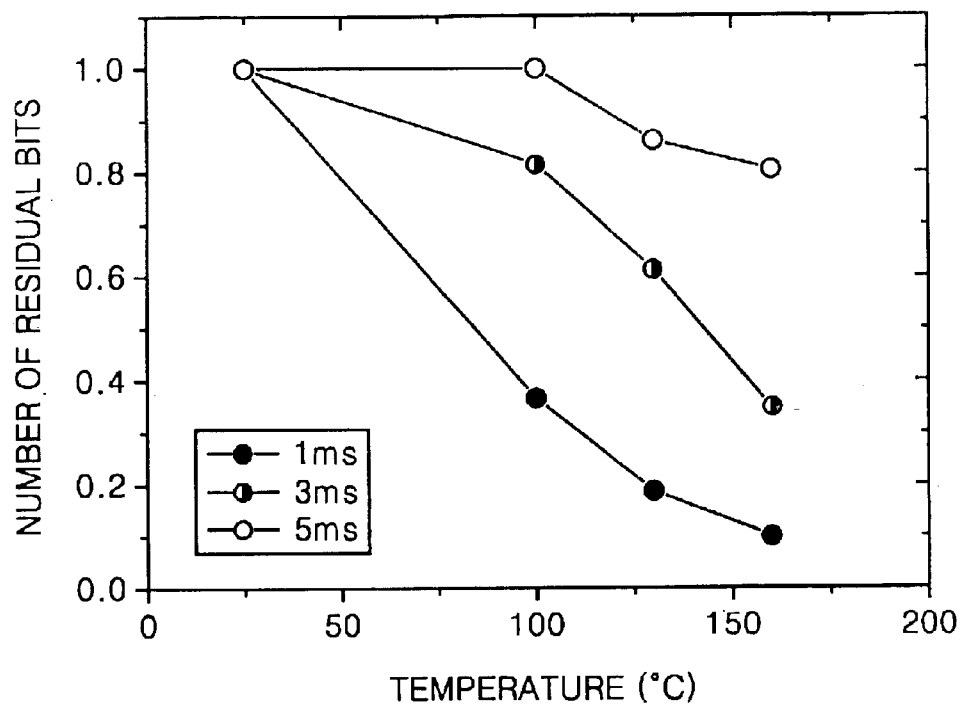
FIG. 5 is a graph showing the number of residual bits as a function of aging temperature in a dot structure, an egg structure, and a ring structure, respectively.
Figure 6:
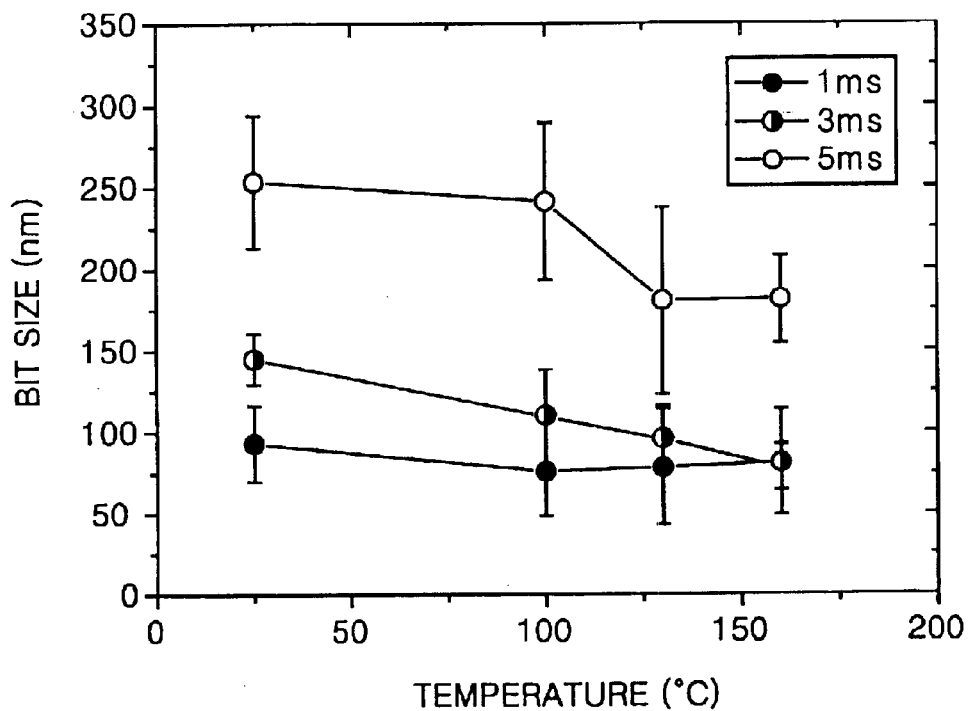
FIG. 6 is a graph showing bit sizes as a function of aging temperature for the dot structure, the egg structure, and the ring structure, respectively.

FIGS. 5 and 6 are graphs showing the number of residual bits and a bit size, respectively, versus temperature in order to compare thermal stability and retention loss characteristics among different structures. Here, a residual bit indicates a domain for which a full width half maximum (FWHM) is non-zero in a line profile of a phase image.

FIG. 5 is a graph showing the number of residual bits in a dot structure (1 ms), an egg structure (3 ms), and a ring structure (5 ms), respectively. Here, the slope is related to a bit retention loss rate. Referring to FIG. 5, as the temperature increases, the number of residual bits decreases. The dot structure has the highest bit retention loss rate while the ring structure has the lowest bit retention loss rate.

FIG. 6 is a graph showing bit sizes in the dot structure, the egg structure, and the ring structure, respectively. Referring to FIG. 6, the bit size decreases as temperature increases in the egg structure formed by a pulse of 3 ms and the ring structure formed by a pulse of 5 ms, while the dot structure formed by a pulse of 1 ms is independent of temperature. Here, the bit size indicates the size of a residual bit. Bits having a depth less than half of the thickness of a ferroelectric layer disappear from a phase image. Bits disappear from the phase image when they have a depth of 50–60% of the thickness of the ferroelectric layer and when a minimum bit size is set to 75–90 nm in a phase image. The minimum bit size is the same as a minimum bit size in the graph for the dot structure shown in FIG. 6. In other words, bits having a size less than 75 nm disappear from the phase image and thus are included in a decrease of the number of bits.

Accordingly, bits having a size of about 75 nm in the dot structure easily disappear from a phase image as temperature increases. This phenomenon can be inferred from a remarkable decrease of the number of bits in the dot structure shown in FIG. 5. In addition, as shown in FIG. 6, bits formed with a pulse of 1 ms have bit sizes measured at 25° C. in the range of about 70 nm to about 115 nm.

For a bit arrangement in the egg structure, the bit size decreases from 148 nm to 78 nm when the temperature changes from 25° C. to 160° C. It can be inferred from the photographs (d) shown in FIGS. 4A and 4B that the egg structure changes into the dot structure as the bit size decreases. In addition, as shown in FIG. 6, bits formed with a pulse of 3 ms have bit sizes measured at 25° C. in the range of about 130 nm to about 160 nm.

For a bit arrangement in the ring structure, the bit size decreases from 250 nm to 180 nm when the temperature changes from 25° C. to 160° C. It can be inferred from the photographs (g) shown in FIGS. 4A and 4B that the ring structure changes into the egg structure as the bit size decreases. However, it can be inferred from FIG. 5 that the least number of bits is decreased. In addition, as shown in FIG. 6, bits formed with a pulse of 5 ms have bit sizes measured at 25° C. in the range of about 210 nm to about 270 nm.

It can be concluded from FIGS. 4A through 6 that the structure of bits greatly influences the bit retention loss characteristics. It can be inferred that a bit arrangement having the ring structure, in which a domain is formed completely penetrating a ferroelectric layer, is much more thermally stable than the egg or dot structure, in which a domain is formed not penetrating a ferroelectric layer. Accordingly, the present invention can provide a thermally-stable ferroelectric memory by forming a ferroelectric layer having a thickness which is not greater than a bit size so that a domain in which a dielectric polarization is formed completely penetrates the ferroelectric layer, as shown in FIGS. 1A through 1C.

The present invention provides a non-volatile ferroelectric memory which is thermally stabilized, thereby realizing a reliable memory which can store information at high speed and high density and has an improved memory retention ability.

While this invention has been particularly shown and described with reference to a preferred embodiment thereof, the present invention is not restricted to the above-described embodiment. For example, it will be apparent that the shape of a bit can be changed by those skilled in the art without departing from the spirit of the invention. Therefore, the scope of the invention is defined not by the detailed description of the invention but by the appended claims.

As described above, a ferroelectric memory of the present invention has a bit having a ring structure in which a domain is formed penetrating a ferroelectric layer, thereby increasing thermal stability and memory retention time.

What is claimed is:

1. A ferroelectric memory comprising:
    a lower electrode; and
    a ferroelectric layer formed on the top surface of the lower electrode such that a domain having a dielectric polarization is set as a bit,
    wherein the thickness of the ferroelectric layer is not greater than a width of the bit.

2. The ferroelectric memory of claim 1, wherein the thickness "d" of the ferroelectric layer satisfies the following formula with respect to the area A of the bit:

$$d \leq 2\sqrt{A/\pi}.$$

3. The ferroelectric memory of claim 1, wherein the domain completely penetrates the thickness of the ferroelectric layer.

4. The ferroelectric memory of claim 3, wherein the domain has a ring shape formed within the ferroelectric layer.

5. The ferroelectric memory of claim 1, wherein the domain has a ring shape formed within the ferroelectric layer.

6. The ferroelectric memory of claim 1, wherein said width of the bit is approximately 250 nm.

7. The ferroelectric memory of claim 1, wherein said width of the bit is in the range of about 70 nm to about 115 nm.

8. The ferroelectric memory of claim 1, wherein said width of the bit is in the range of about 130 nm to about 160 nm.

9. The ferroelectric memory of claim 1, wherein said width of the bit is in the range of about 210 nm to about 270 nm.

10. A ferroelectric memory comprising:
    a planar electrode; and
    a planar ferroelectric layer formed on a surface of the planar electrode wherein data bits are recorded as domains in the planar ferroelectric layer, each domain having a dielectric polarization oriented in one of two opposite directions, wherein a thickness of the planar ferroelectric layer is less than or equal to a domain width, and wherein the domains are disposed adjacent to each other in a manner that allows reading the data bits with a probe tip.

11. The ferroelectric memory of claim 10, wherein the thickness "d" of the ferroelectric layer satisfies the following formula with respect to a domain area A:

$$d \leq 2\sqrt{A/\pi}.$$

12. The ferroelectric memory of claim 10, wherein the domains completely penetrate the thickness of the ferroelectric layer.

13. The ferroelectric memory of claim 12, wherein the domains have ring shapes formed within the ferroelectric layer.

14. The ferroelectric memory of claim 10, wherein the domains have ring shapes formed within the ferroelectric layer.

15. The ferroelectric memory of claim 10, wherein said domain width is approximately 250 nm.

16. The ferroelectric memory of claim 10, wherein said domain width is in the range of about 70 nm to about 115 nm.

17. The ferroelectric memory of claim 10, wherein said domain width is in the range of about 130 nm to about 160 nm.

18. The ferroelectric memory of claim 10, wherein said domain width is in the range of about 210 nm to about 270 nm.

* * * * *